United States Patent [19]
Carns et al.

[11] Patent Number: 6,165,846
[45] Date of Patent: Dec. 26, 2000

[54] METHOD OF ELIMINATING GATE LEAKAGE IN NITROGEN ANNEALED OXIDES

[75] Inventors: Timothy K. Carns, Meridian; John A. Smythe, III, Boise; John A. Ransom, Nampa; Bernice L. Kickel, Boise, all of Id.; John E. Berg, Palo Alto, Calif.

[73] Assignee: Zilog, Inc., Campbell, Calif.

[21] Appl. No.: 09/260,913

[22] Filed: Mar. 2, 1999

[51] Int. Cl.$^7$ .................................................. H01L 21/336
[52] U.S. Cl. .......................... 438/264; 438/239; 438/211; 438/585; 365/185.01
[58] Field of Search .................................... 438/211, 239, 438/585; 326/41; 365/185.01

[56] References Cited

U.S. PATENT DOCUMENTS

| | | | |
|---|---|---|---|
| 5,455,790 | 10/1995 | Hart et al. | 365/185.11 |
| 5,464,792 | 11/1995 | Tseng et al. | 438/585 |
| 5,526,307 | 6/1996 | Yiu et al. | 365/185.01 |
| 5,530,378 | 6/1996 | Kucharewski, Jr. et al. | 326/41 |
| 5,538,923 | 7/1996 | Gardner et al. | 438/264 |
| 5,557,122 | 9/1996 | Shrivastava et al. | 257/309 |
| 5,590,274 | 12/1996 | Mehta | 438/211 |
| 5,661,053 | 8/1997 | Yuan | 438/257 |
| 5,861,347 | 1/1999 | Maiti et al. | 438/787 |
| 6,015,732 | 1/2000 | Williamson et al. | 438/253 |

OTHER PUBLICATIONS

Sharma, Umesh, et al.; "Vertically Scaled, High Reliability EEPROM Devices with Ultra–thin Oxynitride Films Prepared by RTP in $N_2O/O_2$ Ambient"; *International Electron Devices Meeting Technical Digest*, San Francisco, CA; Dec. 13–16, 1992; pp. 17.5.1–17.5.4.

Fukuda, H.; et al.; "High–Performance Scaled Flash–Type EEPROMs with Heavily Oxynitrided Tunnel Oxide Films"; *International Electron Devices Meeting Technical Digest*; San Francisco, CA; Dec. 13–16, 1992; pp. 17.6.1–17.6.4.

Hattangady, S.V., et al.; "Ultrathin nitrogen–profile engineered gate dielectric films"; *International Electron Devices Meeting Technical Digest*; San Francisco, CA; Dec. 8–11, 1996; pp. 19.1.1–19.1.4.

Kooi, E., et al.; "Formation of Silicon Nitride at a Si–$SiO_2$ Interface during Local Oxidation of Silicon and during Heat–Treatment of Oxidized Silicon in $NH_3$ Gas"; *Journal of the Electrochemical Society*; vol. 123, No. 7; Jul. 1976; pp. 1117–1120.

Shankoff, T.A., et al.; "Bird's Beak Configuration and Elimination of Gate Oxide Thinning Produced during Selective Oxidation"; *Journal of the Electrochemical Society*; vol. 127, No. 1; Jan. 1980; pp. 216–222.

Goodwin, C.A. and J.W. Brossman; "MOS Gate Oxide Defects Related to Treatment of Silicon Nitride Coated Wafers Prior to Local Oxidation"; *Journal of the Electrochemical Society*; vol. 129, No. 5; May 1982; pp. 1066–1070.

(List continued on next page.)

*Primary Examiner*—Charles Bowers
*Assistant Examiner*—William M. Brewster
*Attorney, Agent, or Firm*—Majestic, Parsons, Siebert & Hsue

[57] ABSTRACT

The improvement of thin tunnel oxides used in EEPROM and FLASH tecnologies using post-oxidation annealing in nitrogen causes defects in subsequent oxide films. These are manifested by oxide thinning at the bird's beak and result in high gate leakage. As the time and temperature to the post-oxidation annealing are increased for improved tunnel oxide performance, the number of defects increases rapidly. A method of realizing the improved tunnel oxide $Q_{BD}$ using higher post-oxidation time and temperature annealing while at the same time not degrading the quality of subsequent gate oxides is shown. The use of sacrificial oxidation and strip just prior to the transistor gate oxidation is described. This process removes the additional nitride which exists at the field edges, leading to the oxide thinning. As a result, improved tunnel oxide integrity can be achieved without degradation of high and low voltage transistors.

42 Claims, 8 Drawing Sheets

OTHER PUBLICATIONS

Voors, I.J., et al.; "Gate Oxide Reliability in a Sealed Interface Local Oxidation Scheme"; ESSDERC'89, 19th European Solid State Device Research Conference; Berlin; Sep. 11–14, 1989; pp. 361–365.

Tseng, Hsing–Huang and Philip J. Tobin; "A Double Sacrificial Oxide process for Smoother 150 Å $SiO_2$ Gate Oxide Interfaces"; *The Electrochemical Society Extended Abstracts*; vol. 92–1; St. Louis, Missouri; May 17–22, 1992; pp. 392–394.

Yoneda, Kenji, et al.; "Reliability Degradation Mechanism of Ultrathin Tunneling Oxide by Postannealing"; *Journal of the Electrochemical Society*; vol. 138, No. 7; Jul. 1991; pp. 2090–2095.

Yoneda, K., et al.; "Reliability Degradation Mechanism of the Ultra Thin Tunneling Oxide by the Post Annealing"; 1990 Symposium on VLSI Technology; Honolulu; Jun. 4–7, 1990; pp. 121–122.

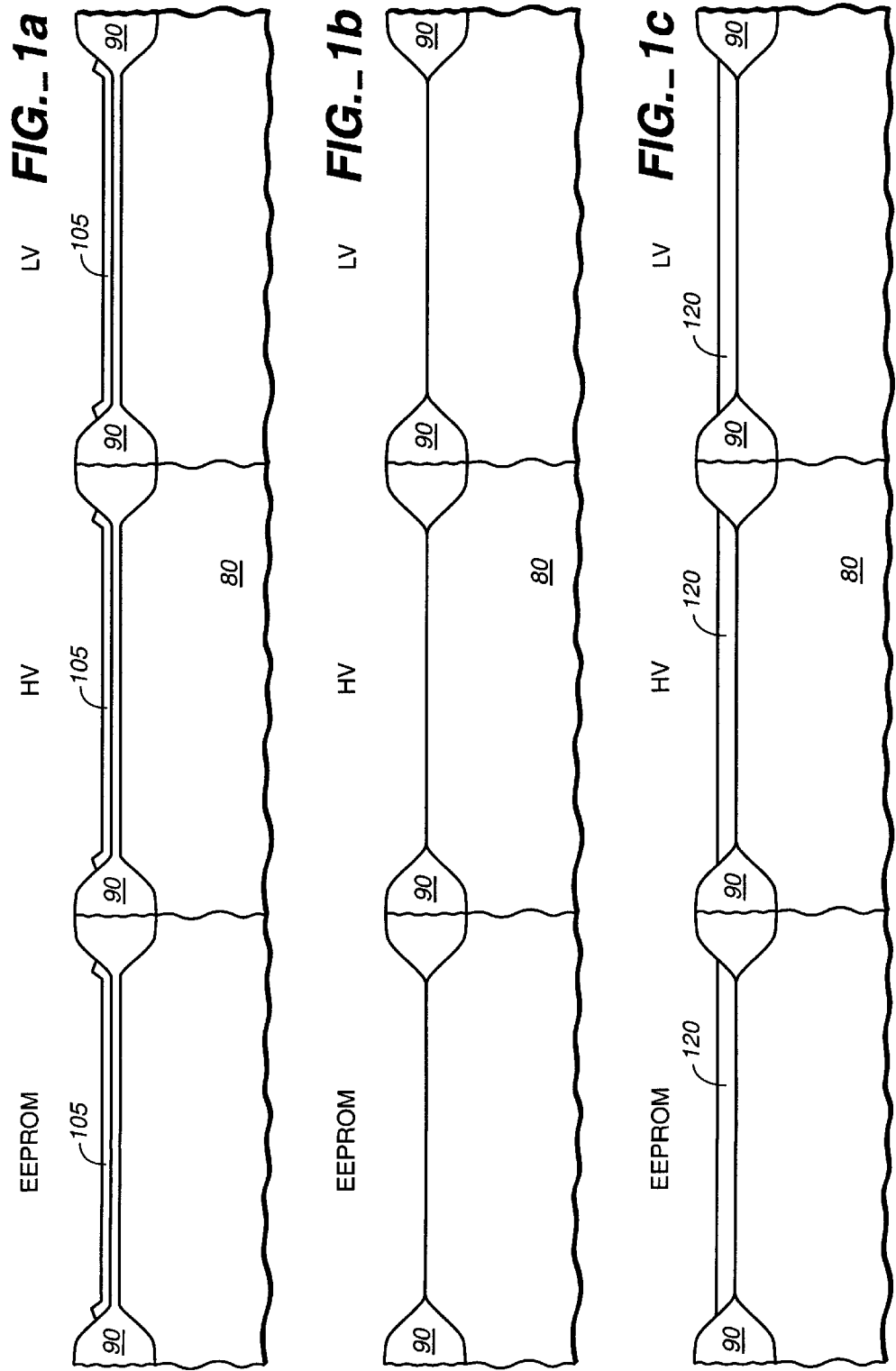

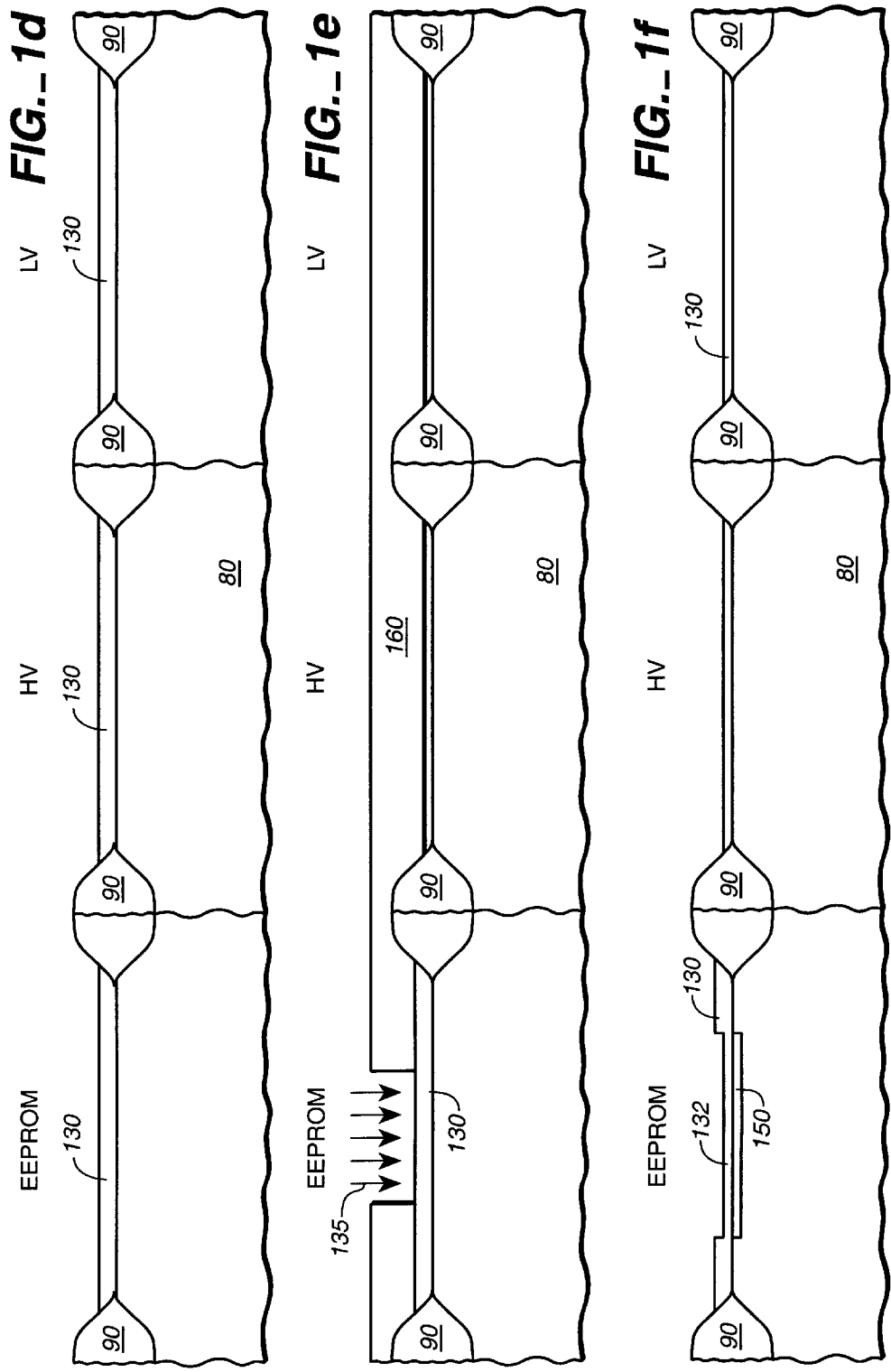

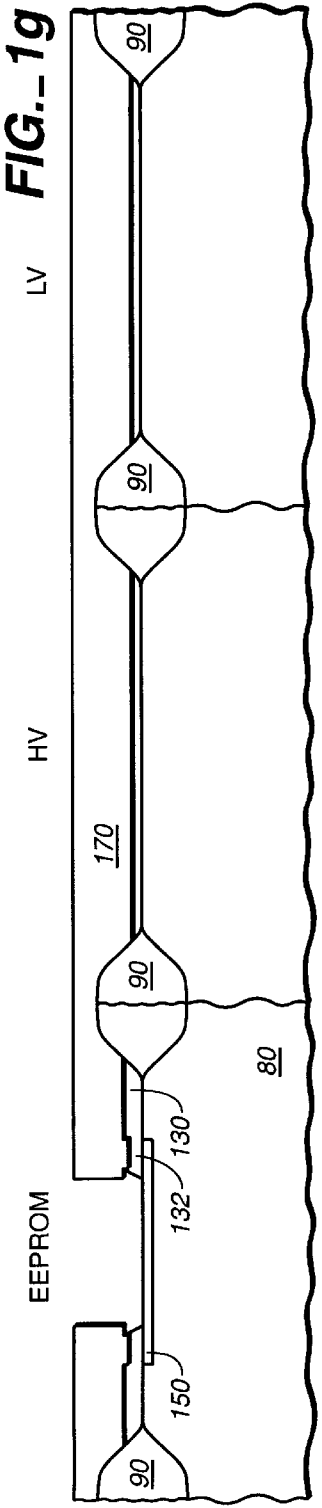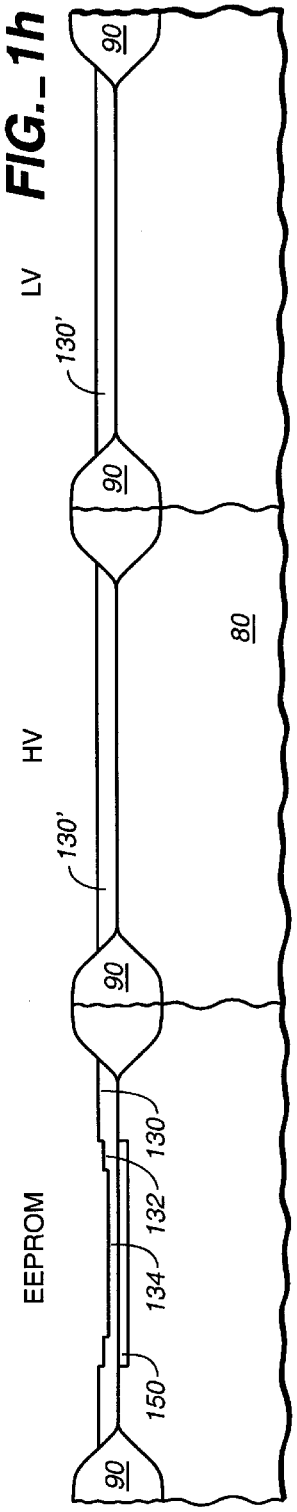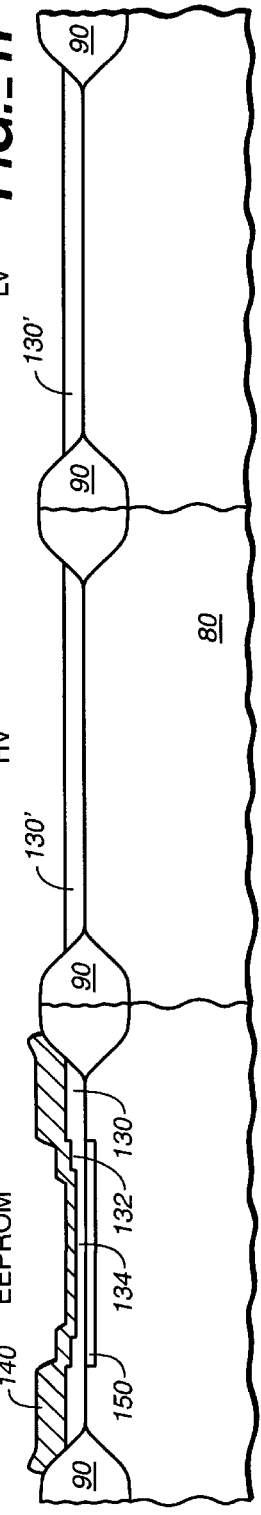

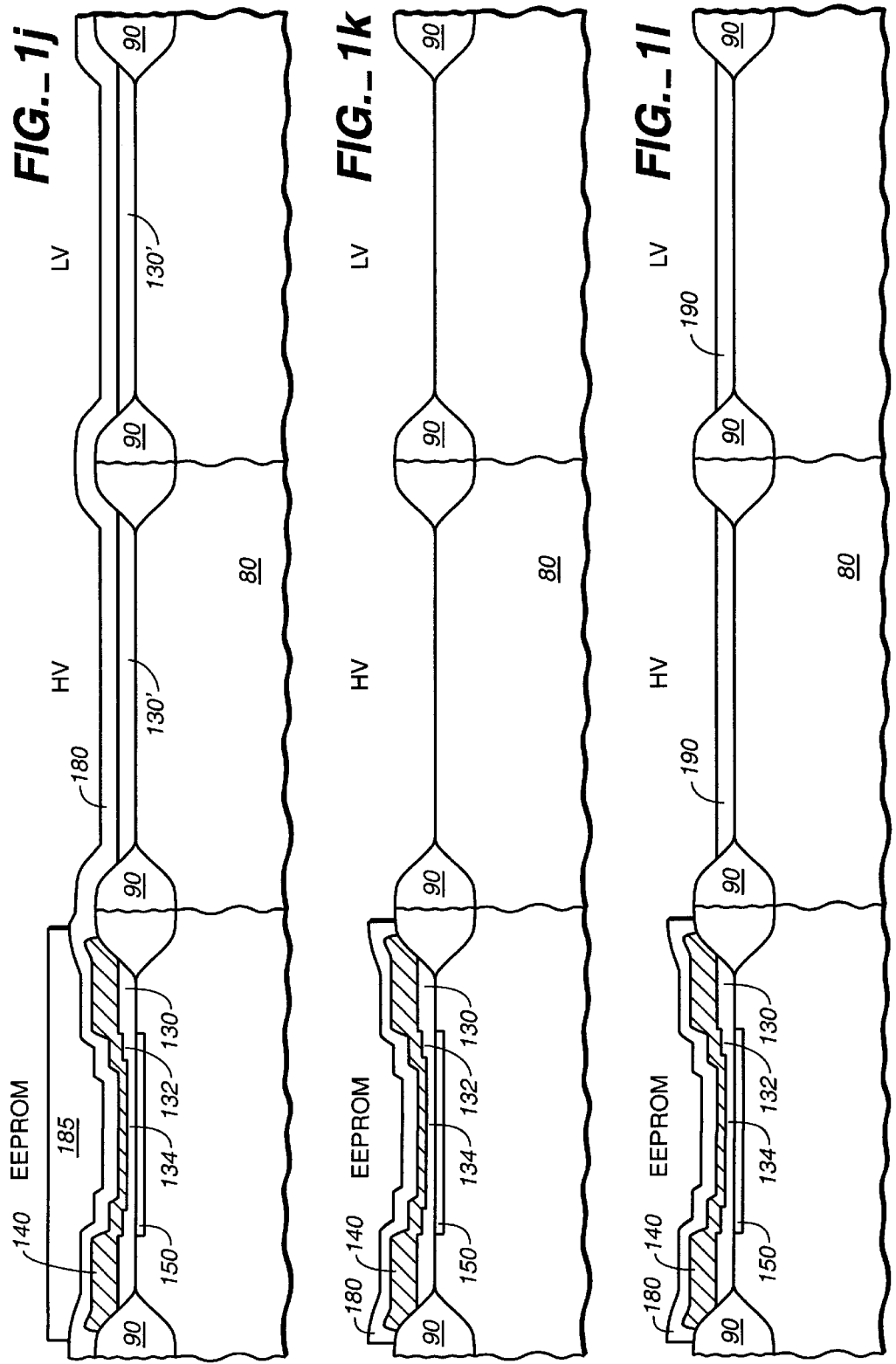

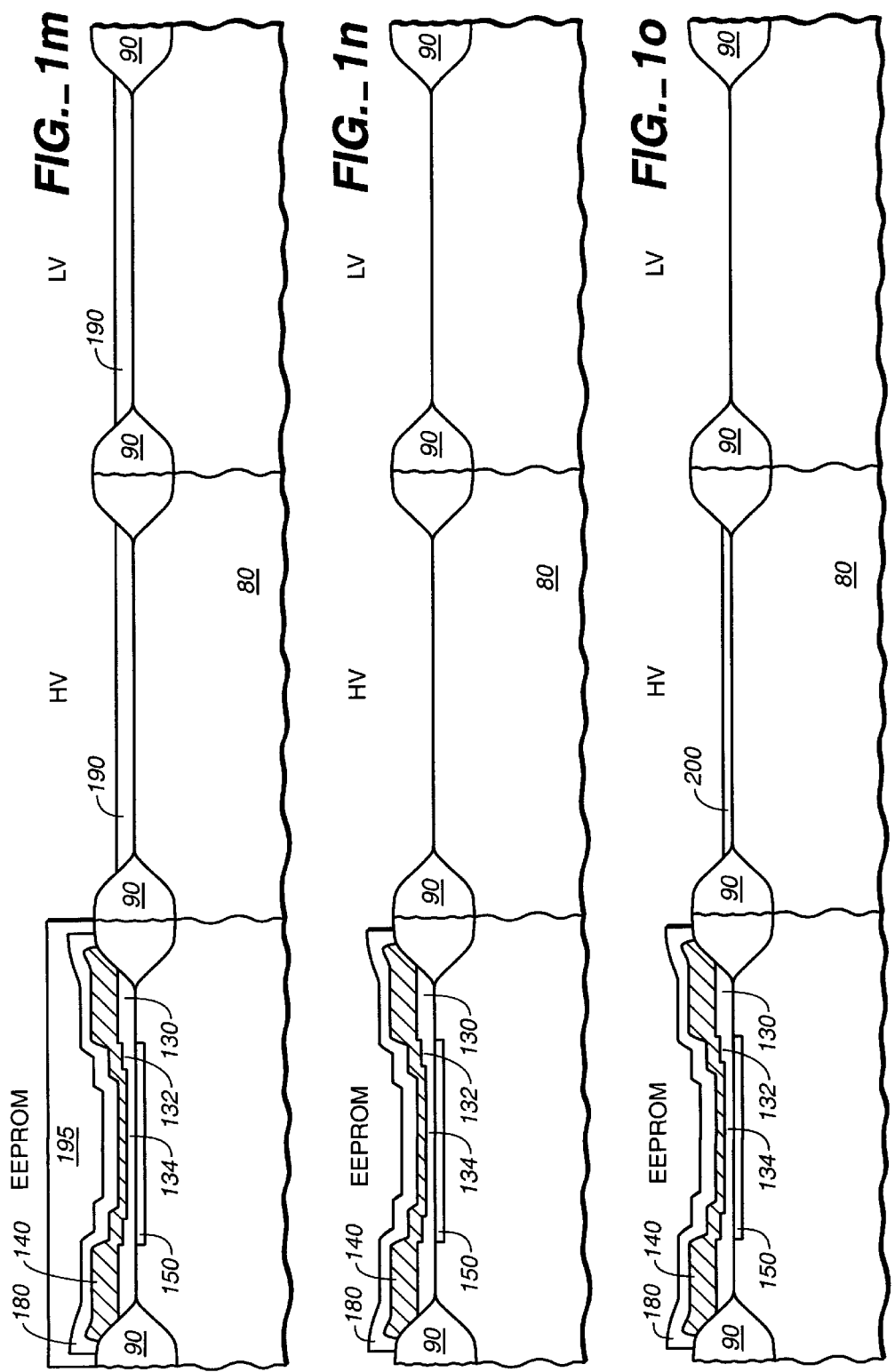

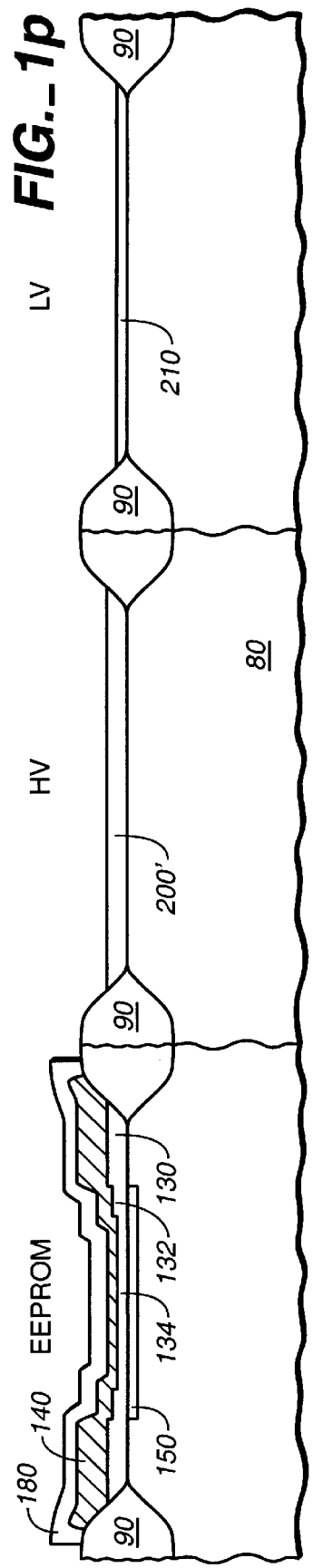
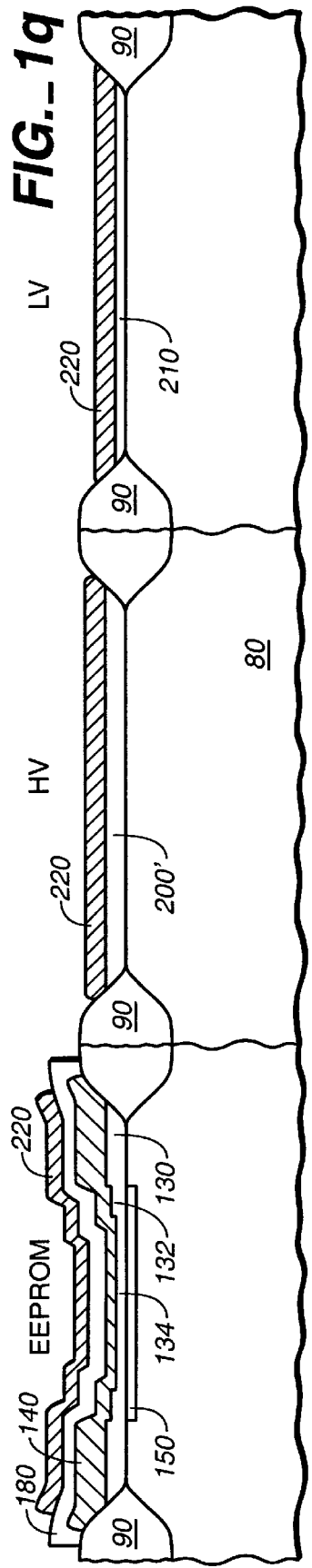

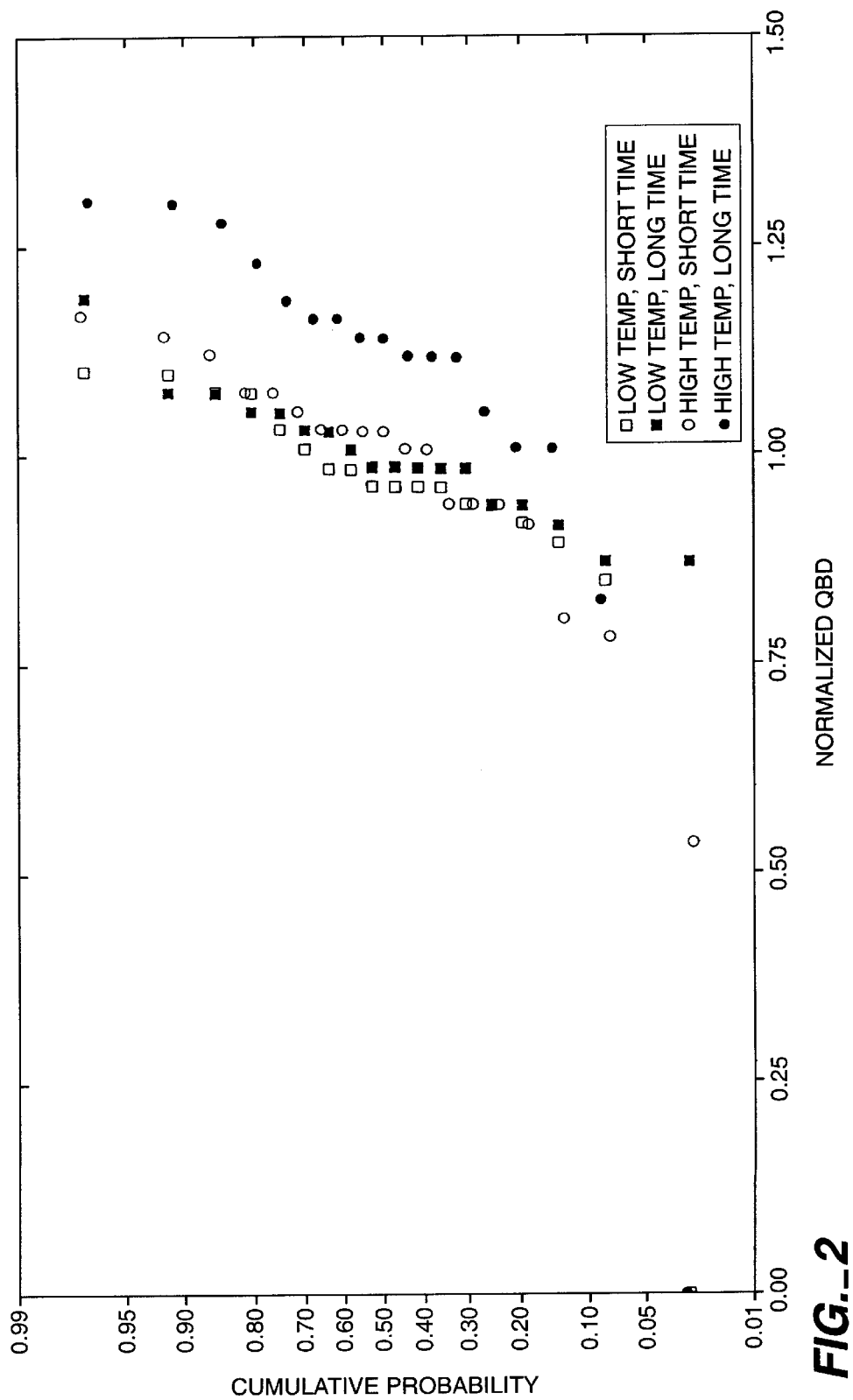
FIG._2

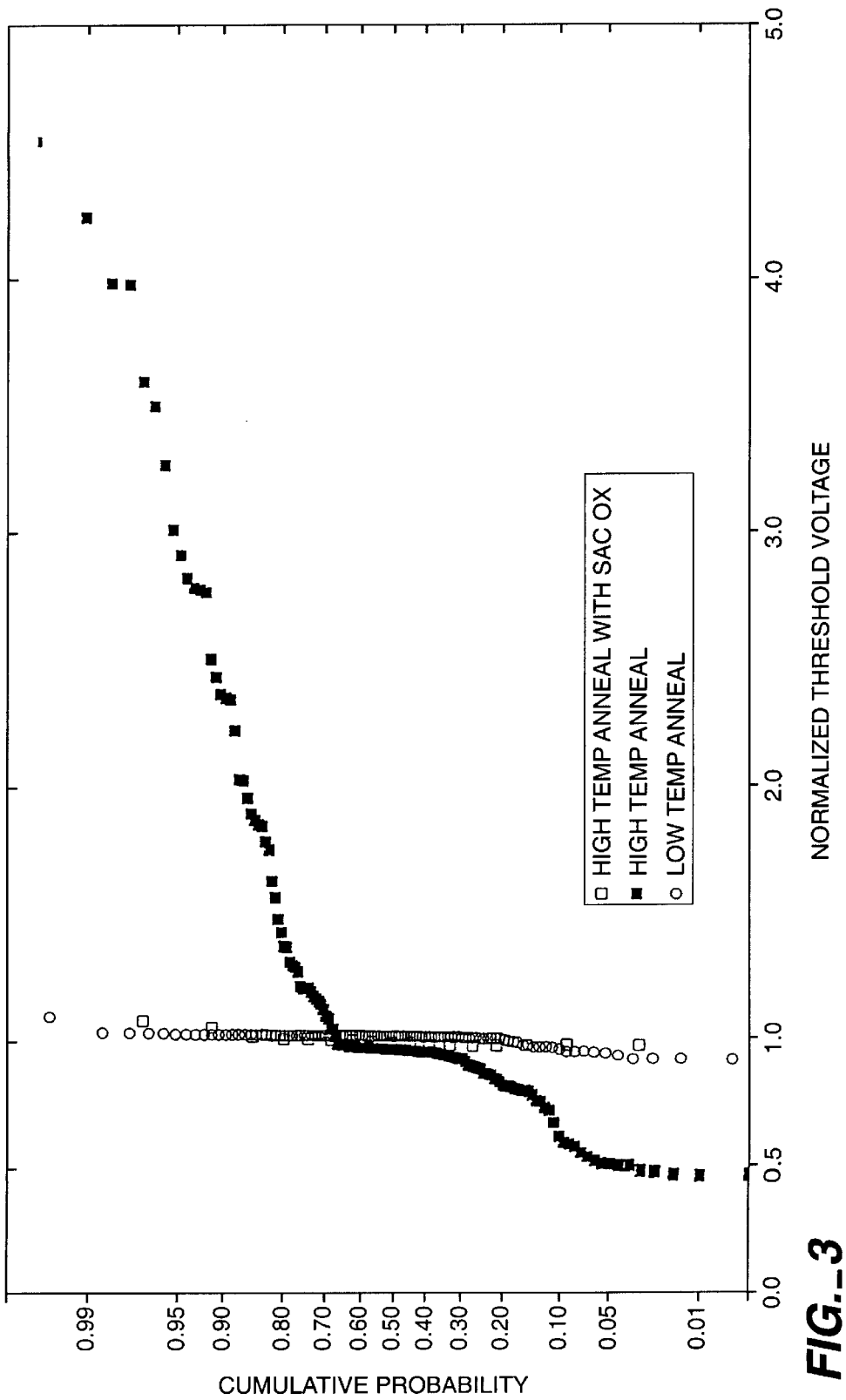
FIG._3

METHOD OF ELIMINATING GATE LEAKAGE IN NITROGEN ANNEALED OXIDES

BACKGROUND OF THE INVENTION

This invention relates generally to the fabrication of semiconductor devices, and in particular to nonvolatile memories.

The ability to manufacture high quality oxides is of extreme importance in the production of semiconductor devices. As the need for ever thinner oxides has increased, the requirement for major improvements to obtain reliable ultra thin oxide films has become vital. This is especially true in the tunnel oxides of Electrically Erasable Programmable Read-Only Memories (EEPROMs), where the oxide may be less than 100 Å thick. In order to improve these oxides, all phases of their manufacture continue to be examined for possible improvements. In making these improvements, it is also vital to maintain high levels of integrity for the other parts of the memory cell, such as the performance of the high and low voltage gates as measured in terms of gate leakage. These various requirements often place conflicting demands on the manufacturing process.

In the silicon wafer production process, manufacturers use many differing procedures to manufacture EEPROMs: in FLOating gate Thin OXide (FLOTOX) devices, one variation of the standard series of steps includes:
1) Field Oxidation
2) Nitride Strip
3) Sacrificial Gate Oxidation and Strip
4) EEPROM Oxidation
5) Tunnel Diffusion Implant
6) Tunnel Window Definition
7) Tunnel Oxidation
8) Tunnel Oxide Anneal
9) Poly 1 Deposition, Doping, and Definition
10) ONO Deposition and Definition
11) High Voltage Transistor Gate Oxidation
12) Etch High Voltage Transistor Gate Oxide From Low Voltage Transistor Regions
13) Low Voltage Transistor Gate Oxidation
14) Poly 2 Deposition, Doping, and Definition.

In the manufacture of a standard, non-memory transistor, this process would jump directly from steps 3 to steps 13. Steps 4 through 12 are added for the production of nonvolatile memory circuits, with steps 5 through 7 specific to the thin tunnel oxide needed in a FLOTOX device. Not all of these steps are strictly necessary, or need be in this order, but they are often added to improve the quality of the circuit. Step 3, consisting of a sacrificial gate oxidation and strip, is one such step.

The field oxide of Step 1 is formed using a local oxidation of silicon ("LOCOS") process. One undesired effect of the LOCOS process is a thinning at the edges of oxide layers grown after step 2. This damage is called the "white ribbon problem" or "Kooi effect," due to its description in "Formation of Silicon Nitride at a Si—SiO$_2$ Interface during Local Oxidation of Silicon and during Heat-Treatment of Oxidized Silicon in NH$_3$ Gas" by *E. Kooi*, et al.; *Journal of the Electrochemical Society*; Vol. 123, Number 7; Jul., 1976; and is well known. In growing the field oxides, they encroach under the nitride layer, producing a formation know as a bird's beak due to its shape. It is at the end of the bird's beak that this unwanted thinning occurs. Since this thinning, caused by a nitride growth under the oxide, degrades the quality of the subsequent oxides, it needs to be corrected.

The sacrificial gate oxidation and strip of steps 3 is a widely used method to eliminate the white ribbon problem. After stripping the masking nitride and underlying pad oxide in step 2, a "sacrificial" gate oxide is grown and then etched away before growing the final gate oxide. This results in smaller gate leakage currents and a lower defect density. Many variations are used to optimize this procedure at the LOCOS stage, including repeating this step in a double, back-to-back sacrificial oxide process as in "Gate Oxide Reliability in a Sealed Interface Local Oxidation Scheme," by I. J. Voors, et al.; ESSDERC '89, 19th *European Solid State Devices Research*; Sept. 1989; and in "A Double Sacrificial Oxide Process for Smoother 150 Å SiO$_2$ Gate Oxide Interfaces," H. H. Tseng, et al.; *Exetended Abstracts of the Meeting of the Electrochemical Society; Spring* 1992.

After step 3, a non-volatile memory such as an EEPROM is fabricated in steps 4–12. This allows the possibility of changing the order of some steps, such as moving the sacrificial oxidation and strip to after the tunnel diffusion implant of step 5. This is done, for instance, in U.S. Pat. No. 5,538,913 issued to Gardner et al. on May 27, 1994, where it is combined with the post-oxidation anneal, shown above as step 8.

This post-oxidation anneal of step 8 is another stage not required, but included to improve the tunnel oxide. This anneal enhances the integrity of the thin gate oxides of step 7 and also the dopant diffusion of step 5. These improvements can be quantified in terms of important quantities such as the charge to breakdown, $Q_{BD}$, of the tunnel oxides in an EEPROM. There are several variations on the process, such as that described in co-pending U.S. patent application Ser. No. 09/215,797 of Berg, et al. entitled "Method of Fabrication a High Quality Thin Oxide." It is generally found that the $Q_{BD}$ of tunnel oxide is improved, as both the time and the temperature used for annealing are increased. The ambient environment is also important, with the amount and form of nitrogen present having a large effect on the quality of the result.

Although this post-oxidation annealing in nitrogen improves the quality of the thin oxide, it has a detrimental effect on subsequent gate oxides, such as those formed in steps 11–13 for the high and low voltage gates. This can produce excessive leakage current through the gate oxide measurable, for example, in the large variation of the threshold voltages of the narrow width high voltage devices. The effect is particularly acute in the first oxides formed after the anneal, for the high voltage devices, compromising transistor drive capability as well as reliability. These problems are compounded by the result that, while an increase in both the time and temperature of the anneal improves the quality of the thin oxide, both of these further degrade transistor performance.

Thus, the improvement of thin tunnel oxides used in EEPROM and FLASH technologies using post-oxidation annealing in nitrogen causes defects in subsequent oxide films. These are manifested by oxide thinning at the bird's beak and result in high gate oxide leakage. As the time and temperature to the post-oxidation annealing are increased for improved tunnel oxide performance, the number of defects increases rapidly. Further improvements are needed to perfect the thin oxide forming process in order to produce a robust oxide without sacrificing transistor performance.

SUMMARY OF THE PRESENT INVENTION

Therefore, it is an object of the invention to provide a method for more effectively providing a nonvolatile semiconductor memory with a robust tunnel/thin oxide while also maintaining high levels of transistor performance through a high quality gate oxide.

A method of realizing the improved tunnel oxide $Q_{BD}$ using higher post-oxidation time and temperature annealing while at the same time not degrading the quality of subsequent gate oxides is shown. The use of a sacrificial oxidation and strip just prior to the transistor gate oxidation is described. This is much later in the fabrication process than is normal, occurring after the first polysilicon layer and interpoly dielectric have been deposited and defined. This process removes the additional nitride which exists at the field edges, leading to the oxide thinning. As a result, improved tunnel oxide integrity can be achieved without degradation of high and low voltage transistors. It is used in combination with an initial sacrificial oxidation and strip done prior to EEPROM oxidation.

Additional objects, features, and advantages of various aspects of the present invention will become apparent from the following description of its preferred embodiments, which description should be taken in conjunction with the accompanying drawings.

BRIEF DESCRIPTION OF THE DRAWINGS

FIGS. 1a–1q are cross-sectional views illustrating the process steps utilized in a CMOS EEPROM process.

FIG. 2 compares thin gate oxides' $Q_{BD}$ for various annealing conditions.

FIG. 3 overlays the probability plots of NMOS threshold voltage for different thin gate anneal treatments.

DESCRIPTION OF THE PREFERRED EMBODIMENT

For specificity, the discussion below is in terms of the preferred embodiment, an Electrically Erasable Programmable Read-Only Memory (EEPROM) with a floating gate thin oxide, but various aspects of the invention are also applicable to a wider class of nonvolatile memories and other processes which require subsequent high quality oxides formed after an initial thin oxide is annealed. The discussion begins with the cross-sectional views of FIGS. 1a–1q that illustrate a preferred sequence of process steps for a CMOS EEPROM memory according to the present invention. The present invention is found in the steps of FIGS. 1l–1m. A summary of these steps, explaining various aspects of the present invention and the benefits they provide, follows. Finally, these aspects are discussed in a more general setting.

Referring to FIG. 1a, field oxides 90 are formed using a LOCal Oxidation of Silicon (LOCOS) process upon a silicon substrate 80. The three regions in FIG. 1 are meant to illustrate the process for different regions on the device: the EEPROM sector is shown on the left of the figure; an area which will become a low voltage transistor is given on the right; and what will become a high voltage transistor is at center. This juxtaposition is meant to give a schematic representation of what steps these different types of areas will go through, not to represent their actual placement on the device. A pad oxide of 100 Å–500 Å is grown, over which is placed a nitride layer 105 of 1000 Å–2000 Å to define the field oxides 90. The nitride layer 105 is then stripped away, leaving the result seen in FIG. 1b. The field oxide 90 defines an active area which lies between them for the purpose of transistor location and are 4000 Å–12,000 Å thick. Specific thicknesses depend on process requirements for voltage and design rules.

FIG. 1c shows a layer of sacrificial oxide 120 that is then grown in a dry oxidation environment to an oxide thickness of 200 Å–500 Å. Under this preferred embodiment, the forming and the subsequent removing of sacrificial oxide prepares the silicon substrate for the formation of the gate dielectric. The sacrificial oxide layer removes contaminants such as dry-etched induced damage and silicon-nitride spots or ribbons formed by the "KOOI effect." However, even with the use of sacrificial oxide layer, contaminations such as silicon nitride spots still cannot be totally removed. Thus, any gate insulator with a thermally grown oxide layer formed would still suffer to some degree from "white ribbon effects." Therefore, in a preferred embodiment according to the present invention, the sacrificial oxide layer is removed with a wet etchants just prior to gate insulator formation. The wet etchant can either be HF or Buffered Oxide Etchant (BOE). The substrate is then rinsed and dried so that a high quality gate insulating layer can be formed over the active region of substrate.

In FIG. 1d, a new layer of approximnately 200 Å–400 Å of EEPROM oxide 130 is grown upon the silicon surface in a dry or steam ambient. Until now, both the high and low voltage regions have been processed the same as the EEPROM sectors but now need to be differentiated. As shown in FIG. 1e, photoresist 160 is then applied on the surface to define regions to receive tunnel doping through the EEPROM oxide 130. An ion implant 135 is then applied on the surface through the exposed EEPROM oxide and into the substrate 80 in the P-well active area. Although other implant elements such as phosphorus can be used in this ion implantation process, Arsenic is preferred because it is found that the resulting thin oxide exhibits a higher quality and higher time dependent dielectric breakdown (TDDB) values. The high voltage and low voltage areas are both blocked from this implant by the photoresist. This photoresist layer 160 is then removed and the surface is prepared for tunnel window definition by an RCA clean operation, resulting in the structure shown in FIG. 1f The RCA cleaning procedure was formulated by Kern and Puotinen at RCA and is well-known in the art.

A second photoresist layer 170 is then applied to define the tunnel oxide region. The resulting structure is shown in FIG. 1g.

In the preferred embodiment of the present invention, a layer of tunnel or gate oxide 134 is grown using a steam oxidizing ambient comprising a mixture of the hydrogen $H_2$ and oxygen $O_2$ gases as described in U.S. patent application Ser. No. 09/215,797 of Berg, et al. entitled "Method of Fabrication a High Quality Thin Oxide" and filed Dec. 18, 1998, which is hereby incorporated by reference herein. As this also thickens the oxide 130 outside of the EEPROM sector, it is now relabelled as 130' in those regions to reflect this change.

Referring to FIG. 1h, the second photoresist layer 170 pattern is translated into the EEPROM oxide 132 layer using BOE. In the preferred embodiment as shown, the second photoresist layer removal is completed as part of the same process. In addition, the EEPROM oxide 132 damaged by the arsenic implant 135 is etched by a RCA cleaning step. The undamaged oxide 130 is not substantially etched. The subsequent tunnel oxide operation drives the arsenic implant layer 150 into the substrate 100, thereby lowering the surface concentration of the arsenic. In addition, the subsequent thin oxide forming operation activates the arsenic implant that forms an N- layer in the P-well. Note that this oxide is also allowed to grow in the HV and LV regions.

Subsequent to the steam oxidization step, the thin oxide is annealed to improve its quality. There are many variations on the nitrogen anneal treatment, the preferred embodiment being that described in the Berg et al. application incorporated above.

As shown in FIG. 1*i*, an amorphous silicon layer is then deposited subsequent to the nitrous oxide annealing step. The amorphous silicon layer is then doped with phosphorous and defined to form the floating gate structure of the EEPROM device. In particular, a first amorphous silicon layer, or Poly 1, 140 is deposited above tunnel oxide 134 to form a structure useful to an EEPROM cell oxide 134 is high enough. The charge is then stored on this conductive layer.

Interpoly dielectric layers 180 are subsequently created and then selectively removed from non-EEPROM areas using a combination of dry and wet etching. In the preferred embodiment, the dielectric layers consist of an Oxide-Nitride-Oxide (ONO) sandwich. This is shown in FIG. 1*j* along with ONO resist mask 185 used to define the dielectric. Typical values for the ONO sandwich will be 100 Å–300 Å for the bottom and middle layers, and 50 Å–100 Å for the top oxide, depending on technology. In FIG. 1*k*, the ONO layer 180 has been defined and the mask 185 removed, along with the ONO and EEPROM/tunnel dielectric layers (180 and 130') formed in the HV and LV regions.

The preferred embodiment of the present invention is in the next series of steps, shown as in FIGS. 1*l*–1*n*. This consists of depositing a second, independent sacrificial oxidation layer and etch occurring after the deposition and etch of the Poly 1, 140 and dielectric 180. This 200 Å–400 Å thick sacrificial oxidation layer 190 for the HV and LV gates is shown in FIG. 1*l*. Unless the top layer of the ONO dielectric in the EEPROM sector is protected, it will also be etched away with the sacrificial layer. FIG. 1*m* shows the protective ONO resist mask 195. The result after the complete removal of the oxide layer in the region external to the EEPROM sector and mask removal is FIG. 1*n*: although, as drawn, this is the same as FIG. 1*k*, for reasons described below, these steps have improved the quality of the device.

A high voltage gate oxide 200 is then formed to a thickness of 100 Å–300 Å in both the high and low voltage areas and then etched away from the low voltage region, resulting in FIG. 1*o*. Another layer of oxide then is applied in FIG. 1*p*, supplying the 100 Å–300 Å thick low voltage gate oxide 210 and increasing the thickness of the high voltages gate oxide 200' to a thickness of 200 Å–400 Å: the actual thickness will depend on the performance requirements of these transistors.

A second amorphous silicon layer, or Poly 2, 220 is then deposited, doped, and etched, the end result being shown in FIG. 1*q*.

These steps can be summarized as:
1) Field Oxidation
2) Nitride Strip
3) Sacrificial Gate Oxidation and Strip
4) EEPROM Oxidation
5) Tunnel Diffusion Implant
6) Tunnel Window Definition
7) Tunnel Oxidation
8) Tunnel Oxide Anneal
9) Poly 1 Deposition, Doping, and Definition
10) ONO Deposition and Definition
   10.5*a*) Sacrificial Oxide Growth
   10.5*b*) Sacrificial Oxide Mask and Strip
11) High Voltage Transistor Gate Oxidation
12) Etch High Voltage Gate Oxide From Low Voltage Transistor Regions
13) Low Voltage Transistor Gate Oxidation
14) Poly 2 Deposition, Doping, and Definition.

Except for steps 10.5, which correspond to FIGS. 1*l*–1*n*, this is the same list of steps as above in the background section. These steps are added to reduce gate leakage in the high and low voltage gates while still maintaining a high quality tunnel oxide. This sacrificial oxidation and strip differs from the prior art in two aspects: first, in that it is a second, independent sacrificial oxidation and strip; and second, in that it occurs after the deposition of the Poly 1 and dielectric layers of steps 9 and 10.

The standard sacrificial gate oxidation and strip is part of the LOCOS process, included here as step 3. Variations in the prior art include repeating this step to produce a double, back to back oxidation and strip—but this still just occurs as a part of the LOCOS process in a more complicated variation of the single oxidation and strip in step 3. In the present invention, step 10.5 is a second, distinct process. In is no longer part of the LOCOS phase and is separated from the oxidation and strip of steps 3 by the EEPROM oxidation and tunnel oxide formation of steps 4–8. It also occurs after steps 9 and 10, making the process more involved. At step 3, only the field oxides have been formed on the substrate through the LOCOS process, whereas in step 10.5 the EEPROM oxides, first amorphous silicon layer, and ONO dielectric layer are all in place.

The inclusion of a sacrificial oxidation and strip at this later stage, with the additional structure of the EEPROM areas in place, is more complicated than that done in the LOCOS phase. To protect the EEPROM sector, particularly the top oxide layer of the ONO dielectric, the resist mask shown in FIG. 1*m* must be used. Even in the non-EEPROM sectors, the etch must be controlled to prevent the removal of too much field oxide due to inclusion of this additional process. In addition, the thickness and temperature for the sacrificial oxidation must be optimized to eliminate defects in the subsequent oxidations, such as in steps 11 and 13.

FIGS. 2 and 3 demonstrate why step 10.5 is included. The purpose of the present invention is the double goal of improving the quality of the EEPROM dielectric and maintaining performance of the high and low voltage transistors. The first of these goals can be quantified in terms of the amount of charge the dielectric can support without breaking down, $Q_{BD}$. One metric of transistor performance and amount of gate leakage is indicated by its threshold voltage, $V_{TH}$. FIG. 2 is a probability plot of the charge to breakdown, $Q_{BD}$, for the tunnel oxide for different process conditions tunnel oxide anneal of step 8. FIG. 3 is a probability plot of the threshold voltages, $V_{TH}$, of the high voltage gates for different process conditions.

The integrity of thin gate oxides is of vital importance in non-volatile memories. An important measure of the quality of these oxides is the amount of charge they can support as given by $Q_{BD}$. One way to increase the $Q_{BD}$ of the tunnel oxides in EEPROM processes is by the post-oxidation nitrogen anneal of step 8. The preferred embodiment is described in the Berg et al. U.S. patent application cited above. The $Q_{BD}$ of the oxide improves with increasing both the temperature and the duration of the anneal, from 1050° C. to 1150° C. and from 30 seconds to 90 seconds. This is shown in FIG. 2 by the solid dots which lie well to the right of the data points from other processes, indicating an improvement of over 10%.

Unfortunately, this anneal is detrimental to the non-EEPROM sectors of the device. It effects both PMOS and NMOS devices, with the NMOS high voltage gates formed in the subsequent process steps particularly susceptible. Increasing the time and temperature of the anneal produces large variations in the high voltage device threshold voltages, due to an increase in source/drain leakage. For very narrow devices, such as here with WL=0.1, this gate leakage has a significant effect on $V_{TH}$ and device off current. This can be seen in FIG. 3 by comparing the tight distribution of data for $V_{TH}$ in a low temperature anneal (the open circles) with wide distribution of the high temperature data (the solid squares), showing a very large tail. Here, the low temperature anneal is at less than 1050° C. and reflects what the low and high voltage devices would see in a non-EEPROM process.

Step 10.5 is included to reconcile these conflicting results. The inclusion of a the second sacrificial oxidation and strip allows the enhanced oxide integrity of the thin gate oxide given by a high temperature, long duration anneal, but without the tradeoff of degradation of the subsequently grown oxides. This is shown in FIG. 3 by the open squares representing the $V_{TH}$ distribution for a high temperature anneal with a sacrificial oxidation. By including step 10.5, the variation is the same for the high temperature anneal process as for the low temperature anneal or non-anneal process on the tunnel oxide.

The cause of the high voltage gate leakage, which steps 10.5 is included to remedy, is due to a thinning of the high voltage gate oxide at the bird's beak edge, as confirmed by scanning electron microscope cross-section. The bird's beak is the narrow point structure formed at the edge of the field oxides 90 as shown in any of FIGS. 1a–1q. It is believed that nitride formed at the this point during the nitrogen anneal is responsible for the thinning and that the subsequent oxidation and strip remove this nitride. This occurs in much the same way that the initial sacrificial gate oxidation and strip of steps 3 removes the white ribbon or Kooi effect nitride. The important differences are that it is a second process occurring after intervening steps 4–8 and that it is not part of the LOCOS process, but after an amorphous silicon layer and dielectric layer have been deposited, where care must be taken in the growth and removal of this oxide to ensure that the EEPROM region, particularly the top oxide of the ONO stack, remain unaltered.

The steps 1–14 given above and represented in FIGS. 1a–1q are for the preferred embodiment of an EEPROM memory of the FLOTOX type with the particular geometry shown. In the manufacture of a standard transistor, it is normal to jump from steps 3 to steps 13, because the EEPROM structure and high voltage gates would be absent. Steps 8–12 are included to produce a nonvolatile memory, with steps 3 and 8 included to improve the tunnel oxide: but these steps are for the preferred embodiment as shown in FIGS. 1a–1q. There are other types and geometries of non-volatile memories where these intermediary steps will differ. In many of these other embodiments, the inclusion of step 10.5 or its renumbered equivalent just prior to the transistor gate oxidation will also improve the high and low voltage gate oxides. Any process requiring two separate sets of high quality oxides, where the first set is annealed and then undergoes further processing before the second set is grown, would benefit from the current invention as the technique preserves the quality of the first oxide, and the structure of which it is part, while improving the quality of later oxides.

Various details of the implementation and method are merely illustrative of the invention. It will be understood that various changes in such details may be within the scope of the invention, which is to be limited only by the appended claims.

What is claimed is:

1. A method of forming circuit elements in at least a first and second non-overlapping regions of an integrated circuit on a semiconductor body, comprising:
    forming a first oxide layer upon at least a portion of the first region of the semiconductor body;
    annealing said first oxide layer;
    sacrificial oxide layer upon at least a portion of the second region of the semiconductor body subsequent to the annealing;
    forming a mask over at least a portion of said first oxide layer subsequent to forming the sacrificial oxide layer; and
    etching said sacrificial oxide layer to expose the semiconductor body, wherein the etching of said sacrificial oxide layer is performed while said mask is over said at least a portion of said first oxide layer.

2. The method as recited in claim 1, wherein annealing said first oxide layer comprises an anneal performed under a nitrous oxide ambient.

3. The method as recited in claim 2, wherein said anneal performed under a nitrous oxide ambient is performed using rapid thermal processing.

4. The method as recited in claim 3, wherein said nitrous oxide ambient in said rapid thermal processing nitrous oxide annealing consists essentially of nitrous oxide gas.

5. The method as recited in claim 4, wherein said rapid thermal processing anneal is performed at a temperature greater than 1050 degrees Celsius.

6. The method as recited in claim 4, wherein said rapid thermal processing anneal is performed for a time period greater than 40 seconds.

7. The method as recited in claim 4, wherein said rapid thermal processing anneal is performed for a time period greater than 40 seconds and at a temperature greater than 1050 degrees Celsius.

8. The method as recited in claim 1, wherein said first oxide layer and said semiconductor body are doped with arsenic.

9. The method as recited in claim 1, further comprising:
    etching at least a portion of said first oxide layer to reduce the thickness thereof prior to annealing said first oxide layer.

10. The method as recited in claim 9, further comprising:
    further growing said first oxide layer, subsequent to etching at least a portion of said first oxide layer to reduce the thickness thereof, and prior to annealing said first oxide layer.

11. The method as recited in claim 10, wherein said first oxide layer serves as a tunnel oxide of an EEPROM cell.

12. The method as recited in claim 10, wherein said first oxide layer serves as a tunnel oxide of a trash memory.

13. A method of forming circuit elements in at least a first and second non-overlapping regions of an integrated circuit on a semiconductor body, comprising:
    forming a first sacrificial oxide layer upon at least a portion of the first region of the semiconductor body;
    etching said first sacrificial oxide to expose said semiconductor body;
    forming a first oxide layer upon at least a portion of the first region of the semiconductor body subsequent to etching said first sacrificial oxide;
    annealing said first oxide layer;
    forming a second sacrificial oxide layer upon at least a portion of the second region of the semiconductor body subsequent to the annealing;

forming a mask over at least a portion of said first oxide layer subsequent to forming said second sacrificial oxide layer; and etching said second sacrificial oxide layer to expose the semiconductor body, wherein the etching of said second sacrificial oxide layer is performed while said mask is over said at least a portion of said first oxide layer.

14. The method as recited in claim 13, wherein annealing said first oxide layer comprises an anneal performed under a nitrous oxide ambient.

15. The method as recited in claim 14, wherein said anneal performed under a nitrous oxide ambient is performed using rapid thermal processing.

16. The method as recited in claim 15, wherein said nitrous oxide ambient in said rapid thermal processing nitrous oxide annealing consists essentially of nitrous oxide gas.

17. The method as recited in claim 16, wherein said rapid thermal processing anneal is performed at temperature greater than 1050 degrees Celsius.

18. The method as recited in claim 16, wherein said rapid thermal processing anneal is performed for time period greater than 40 seconds.

19. The method as recited in claim 16, wherein said rapid thermal processing anneal is performed for a time period greater than 40 seconds and at a temperature greater than 1050 degrees Celsius.

20. The method as recited in claim 13, further comprising:
doping through said first oxide layer into said semiconductor body.

21. The method as recited in claim 20, wherein said first oxide layer and said semiconductor body are doped with arsenic.

22. The method as recited in claim 13, further comprising:
etching at least a portion of said first oxide layer to reduce the thickness thereof prior to annealing said first oxide layer.

23. The method as recited in claim 22, further comprising:
further growing said first oxide layer, subsequent to etching at least a portion of said first oxide layer to reduce the thickness thereof, and prior to annealing said first oxide layer.

24. The method as recited in claim 23, further comprising, subsequent to annealing the first oxide but prior to forming the second sacrificial oxide:
forming a first amorphous silicon layer over at least a portion of said first oxide layer;
forming a dielectric layer over at least a portion of said first amorphous silicon layer.

25. The method as recited in claim 23, further comprising, subsequent to annealing the first oxide but prior to forming the second sacrificial oxide:
forming a first polysilicon layer over at least a portion of said first oxide layer;
forming a dielectric layer over at least a portion of said first polysilicon layer.

26. The method as recited in either of claims 24 or 25, further comprising, subsequent to etching said second sacrificial oxide layer to expose the semiconductor body:
forming a second oxide layer on at least a portion of the second region of the semiconductor body.

27. The method as recited in claim 26, wherein said first oxide layer serves as a tunnel oxide of an EEPROM cell.

28. The method as recited in claim 27, wherein said second oxide layer serves as a gate oxide of an NMOS transistor.

29. The method as recited in claim 27, wherein said second oxide layer serves as a gate oxide of an PMOS transistor.

30. The method as recited in claim 26, wherein said first oxide layer serves as a tunnel oxide of a flash memory.

31. The method as recited in claim 30, wherein said second oxide layer serves as a gate oxide of an NMOS transistor.

32. The method as recited in claim 30, wherein said second oxide layer serves as a gate oxide of an PMOS transistor.

33. The method as recited in claim 1, further comprising:
forming a second oxide layer on at least a portion of the semiconductor body exposed in the second region due to etching said second sacrificial oxide layer to expose the semiconductor body.

34. The method as recited in claim 33, wherein said second oxide layer serves as a gate oxide of a MOS transistor.

35. The method as recited in claim 34, wherein said first region is an EEPROM sector, and wherein said second region is a high voltage transistor sector.

36. The method as recited in claim 34, wherein said first region is an EEPROM sector, and wherein said second region is a low voltage transistor sector.

37. A method of forming circuit elements in at least a first and second non-overlapping regions of an integrated circuit on a semiconductor body, comprising:
forming a first sacrificial oxide layer upon at least a portion of the first region of the semiconductor body;
etching the first sacrificial oxide to expose said semiconductor body;
forming a first oxide layer upon at least a portion of the first region of the semiconductor body subsequent to etching the first sacrificial oxide;
annealing said first oxide layer;
forming a conductive layer over at least a portion of said first oxide layer subsequent to annealing said first oxide layer;
forming a dielectric layer over at least a portion of the conductive layer;
forming a second sacrificial oxide layer upon at least a portion of the second region of the semiconductor body subsequent to forming the dielectric layer;
forming a mask over the dielectric layer subsequent to forming said second sacrificial oxide layer; and
etching said second sacrificial oxide layer to expose the semiconductor body, wherein the etching of said second sacrificial oxide layer is performed while said mask is over the dielectric layer.

38. The method as recited in claim 37, further comprising:
forming a second oxide layer on at least a portion of the second region of the semiconductor body subsequent to etching said second sacrificial oxide layer to expose the semiconductor body.

39. The method as recited in claim 38, wherein said second oxide layer serves as a gate oxide of a MOS transistor.

40. The method as recited in claim 39, wherein said first region is an EEPROM sector, and wherein said second region is a high voltage transistor sector.

41. The method as recited in claim 39, wherein said first region is an EEPROM sector, and wherein said second region is a low voltage transistor sector.

42. The method as recited in claim 37, wherein annealing said first oxide layer comprises an anneal performed under a nitrous oxide ambient.

* * * * *

UNITED STATES PATENT AND TRADEMARK OFFICE
CERTIFICATE OF CORRECTION

PATENT NO. : 6,165,846  
DATED : December 26, 2000  
INVENTOR(S) : Carns et al.

Page 1 of 1

It is certified that error appears in the above-identified patent and that said Letters Patent is hereby corrected as shown below:

<u>Column 8,</u>
Line 8, before "sacrificial", insert -- forming a --.
Line 52, replace "trash", with -- flash --.

Signed and Sealed this

Sixteenth Day of April, 2002

Attest:

JAMES E. ROGAN
*Attesting Officer*   *Director of the United States Patent and Trademark Office*